US012683630B2

(12) United States Patent

Kaynak et al.

(10) Patent No.: US 12,683,630 B2
(45) Date of Patent: Jul. 14, 2026

(54) ERROR DECODING WITH ITERATIVE PARAMETER UPDATING

(71) Applicant: MICRON TECHNOLOGY, INC., Boise, ID (US)

(72) Inventors: Mustafa N. Kaynak, San Diego, CA (US); Mariano Burich, San Diego, CA (US); Sivagnanam Parthasarathy, Carlsbad, CA (US); Eyal En Gad, Fremont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 65 days.

(21) Appl. No.: 18/783,001

(22) Filed: Jul. 24, 2024

(65) Prior Publication Data

US 2026/0031834 A1      Jan. 29, 2026

(51) Int. Cl.
*H03M 13/11*          (2006.01)

(52) U.S. Cl.
CPC ............................... *H03M 13/1125* (2013.01)

(58) Field of Classification Search
CPC ...................... H03M 13/1125; H03M 13/1117
See application file for complete search history.

(56) References Cited

U.S. PATENT DOCUMENTS

| | | | |
|---|---|---|---|
| 7,500,172 B2 | 3/2009 | Shen et al. | |
| 8,161,345 B2 | 4/2012 | Graef | |
| 8,171,375 B2 | 5/2012 | Lin et al. | |
| 8,286,048 B1 * | 10/2012 | Chen .................... | H03M 13/114 |
| | | | 714/752 |
| 8,826,094 B2 | 9/2014 | Blanksby et al. | |
| 2014/0143628 A1 * | 5/2014 | Li ..................... | H03M 13/6591 |
| | | | 714/752 |
| 2017/0093428 A1 * | 3/2017 | Yen ........................ | H03M 13/35 |
| 2017/0199775 A1 * | 7/2017 | Sharifi Tehrani ............................ | |
| | | | H03M 13/1105 |
| 2018/0109269 A1 * | 4/2018 | Richardson .......... | H03M 13/112 |

OTHER PUBLICATIONS

C. He, K. Deng, S. Song and Z. Wang, "col. Weighted Probabilistic GDBF Decoder for Irregular LDPC Codes," 2023 IEEE Computer Society Annual Symposium on VLSI (ISVLSI), Foz do Iguacu, Brazil, 2023.*

* cited by examiner

*Primary Examiner* — Steve N Nguyen
(74) *Attorney, Agent, or Firm* — Tarolli, Sundheim, Covell & Tummino LLP

(57)          ABSTRACT

An error-handling module of a controller determines that a codeword received from a memory device has errors. The error-handing module assigs an initial set of log-likelihood ratios (LLRs) to bits of the codeword based on a column weight (CW) of a low density parity check (LDPC) code. The error-handling module updates the LLRs based on parity check outcomes. The controller decodes embedded data from the codeword based on the updated LLRs.

17 Claims, 5 Drawing Sheets

ERROR DECODING WITH ITERATIVE PARAMETER UPDATING

TECHNICAL FIELD

This disclosure relates to Low-Density Parity-Check (LDPC) decoding to correct errors in data.

BACKGROUND

A memory sub-system includes a memory device designed for data storage. These memory devices are implemented as non-volatile and volatile memory devices in various examples. In some such examples, a host system employs a memory sub-system for the purposes of storing data on the memory devices and for retrieving data from the memory devices.

Low-Density Parity-Check (LDPC) codes are a type of error-correcting code employed to transmit data over communication channels with high efficiency and reliability. Characterized by a sparse parity-check matrix, which predominantly consists of zeros with a relatively low density of ones, LDPC codes facilitate efficient implementation of decoding algorithms such as Belief Propagation and Min-Sum.

DETAILED DESCRIPTION

Figure 1A:
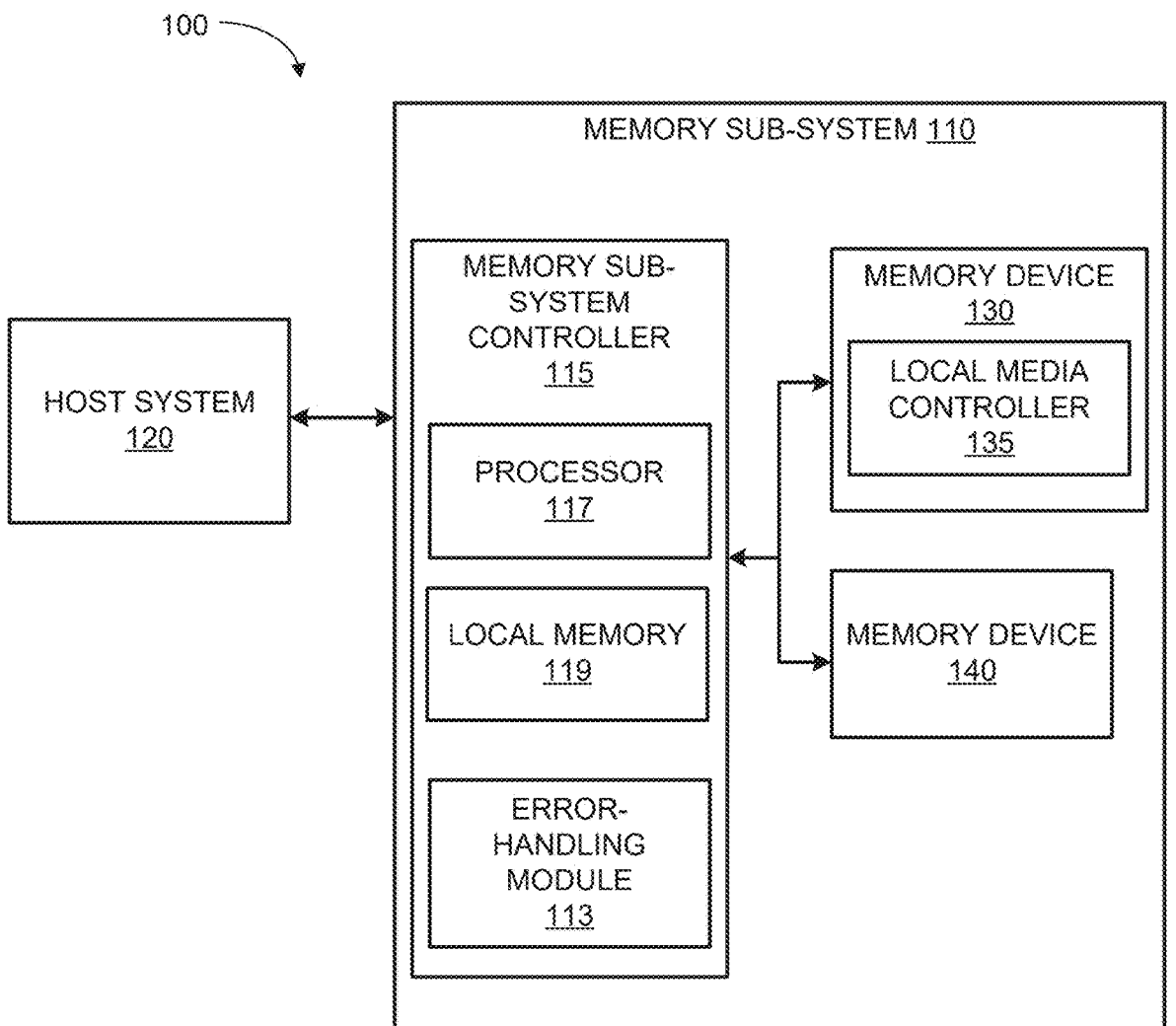
FIG. 1A illustrates system for decoding data from a memory sub-system.

This description relates to adaptive error-handling to curtail an impact of a wide range of high-reliability error rates on low density parity-check (LDPC) algorithms with irregular LDPC codes. High-reliability error rates refer to the bits that read in error from the memory, yet they are assigned high reliability values. A memory sub-system refers to a storage device, a memory module or some combination thereof. The memory sub-system includes a memory device or multiple memory devices that store data. The memory devices could be volatile or non-volatile memory devices.

Some examples of a memory sub-system include high density non-volatile memory devices where retention of data is desired during intervals of time where no power is supplied to the memory device. One example of non-volatile memory devices is a not-AND (NAND) memory device. A non-volatile memory device is a package that includes a die(s). Each such die can include a plane(s). For some types of non-volatile memory devices (e.g., NAND memory devices), each plane includes a set of physical blocks, and each physical block includes a set of pages. Each page includes a set of memory cells, which are commonly referred to as cells. A cell is an electronic circuit that stores information. A cell stores at least one bit of binary information and has various logic states that correlate to the number of bits being stored. The logic states are be represented by binary values, such as '0' and '1', or as combinations of such values, such as '00', '01', '10' and '11'.

A memory device includes multiple cells arranged in a two-dimensional or a three-dimensional grid. In some examples, memory cells are formed on a silicon wafer in an array of columns connected by conductive lines (also referred to as bitlines, or BLs) and rows connected by conductive lines (also referred to as wordlines or WLs). A wordline has a row of associated memory cells in a memory device that are used with a bitline or multiple bitlines to generate the address of each of the memory cells. The intersection of a bitline and a wordline defines an address of a given memory cell.

A block refers to a unit of the memory device used to store data. In various examples, the unit could be implemented as a group of memory cells, a wordline group, a wordline or as individual memory cells. Multiple blocks are grouped together to form separate partitions (e.g., planes) of the memory device to enable concurrent operations to take place on each plane. A solid-state drive (SSD) is an example of a memory sub-system that includes a non-volatile memory device(s) and a memory sub-system controller to manage the non-volatile memory devices.

The memory sub-system controller is configured/programmed to encode the host and other data, as part of a write operation, into a format for storage at the memory device(s). Encoding refers to a process of generating parity bits from embedded data (e.g., a sequence of binary bits) using an error correction code (ECC) and combining the parity bits to the embedded data to generate a codeword. LDPC encoding refers to an encoding method that utilizes an LDPC code to generate the parity bits.

The LDPC code is defined by, among other things, a sparse parity-check matrix, alternatively referred to as an H matrix, denoted as H. Each row of the H matrix embodies a linear constraint imposed on a designated subset of data bits. Entries within the H matrix, either '0' or '1', signify the participation of individual data bits in each constraint. Stated differently, each row of the H matrix represents a parity-check equation, and each column corresponds to a bit in the codeword. During encoding, using the embedded data along with either the H matrix or the generator matrix which is inverse of H matrix parity bits are generated. The generated parity bits are appended to the embedded data to generate an LDPC codeword. The LDPC codeword includes the embedded data and the parity bits, allowing for identification and rectification of errors. The LDPC codeword is storable at the memory device(s) of the memory sub-system.

Additionally, the memory sub-system controller can decode codewords, as part of a read operation, stored at the memory device(s) of the memory sub-system. Decoding refers to a process of reconstructing the original embedded data (e.g., sequence of binary bits) from the codeword (e.g., the encoded original embedded data) received from storage at the memory device(s). LDPC decoding refers to a decoding method that utilizes the LDPC code to reconstruct the original embedded data.

Initially, during LDPC decoding, the LDPC codeword is compared with the expected relationships encoded in the H matrix. In particular, the LDPC codeword is multiplied by a transpose of the H matrix associated with the LDPC code used to encode the LDPC codeword. The result of the multiplication produces a vector (e.g., a syndrome vector), in which each element corresponds to a specific parity-check equation in the sparse parity-check matrix. A syndrome vector with a zero value signifies that the corresponding parity-check equation is satisfied (e.g., no errors or having even number of bit errors in the parity check equation), and a syndrome vector with a non-zero value indicates potential errors impacting the bits involved in the corresponding parity-check equation. Potential errors, for example, may be due to the bits involved in the corresponding parity-check equation being flipped due to noise, interference, distortion, bit synchronization errors or errors from the media itself (both intrinsic and extrinsic). For example, a bit that may have originally been stored as a '0' may be flipped to a '1' or vice versa.

In response to detection of the potential errors, an algorithm of the LDPC decoding, such as a MinSum (alternatively referred to as min-sum) algorithm, iteratively analyzes the LDPC codeword and estimates the most likely values for the data bits. In particular, the algorithm of the LDPC decoding (e.g., decoding algorithm) is initialized with either hard decisions and/or soft decisions of the LDPC codeword. Hard decisions refer to binary decisions made about the LDPC codeword, where each bit is classified as either '0' or '1' based on a threshold. Soft decisions refer a likelihood or confidence score indicating how likely each bit is to be classified as either '0' or '1'. In some instances, soft decisions may be represented as a log-likelihood ratio (LLR) set, in which each LLR of the LLR set is a value that indicates a likelihood or confidence score of a bit of the LDPC codeword to be classified as either '0' or '1'. The LLR is a ratio of the probabilities of receiving a particular signal given the bit is '0' versus the bit being '1' or vice versa. A positive LLR (e.g., a positive value) indicates that '0' is a more likely decision, whereas a negative LLR (e.g., a negative value) indicates that '1' is a more likely decision. The magnitude of the LLR indicates the confidence in this decision. A higher magnitude (or larger value) suggests higher confidence in the decision.

Subsequent to initializing the decoding algorithm with either hard decisions or soft decisions of the LDPC codeword, the decoding algorithm, using a tanner graph, iteratively exchanges messages within the tanner graph. The tanner graph refers to a bipartite graph representation of the H matrix of the LDPC code. The tanner graph includes two types of nodes (i) variable nodes (representing the bits of the codeword) and (ii) check nodes (representing the parity-check equations). Each check node is connected to several variable nodes. The decoding algorithm iteratively exchanges messages within the tanner graph by iteratively exchanging messages between variable nodes and check nodes.

With respect to the decoding algorithm initialized with hard decisions, during each iteration, each check node sends a message to each connected variable node based on the hard decisions. The messages are based on the initialized hard decisions made. That is, the messages indicate a definite '0' or '1'. The variable nodes update their values based on these hard decision messages, and this process repeats iteratively. The decoding algorithm iterates, with each node updating its value based on the incoming messages until the decoding algorithm converges to a stable set of values that satisfy the parity-check equations of the H matrix of the LDPC code or until a maximum number of iterations is reached. This decoder can be considered a hard decision decoder.

With respect to the decoding algorithm initialized with soft decisions, during each iteration, each check node computes and sends a message to each connected variable node based on the soft decisions. The message reflects the likelihood of that a particular bit satisfies the corresponding parity-check equation, given the current estimates of the other bits, based on the initialized soft decisions, involved in that particular parity check. Each connected variable node, based on the message computed by the corresponding check node, and each connected variable node updates its estimate, (e.g., the LLR for the corresponding variable node). Each connected variable node sends back an updated message to the check node, which influences the next message from the check node. This iterative process gradually refines the estimates of the likelihood for each bit, aiming to converge to a consistent set of values that satisfy all parity-check equations of the H matrix of the LDPC code or until a maximum number of iterations is reached. The use of soft decisions in the decoding algorithm is computationally more complex than the hard decisions in the decoding algorithm, but generally results in more accurate decoding (e.g., increased reliability of the error-correction capability, i.e., higher error rate that can be corrected by LDPC).

Codeword error rate (CWER) refers to a metric used to quantify a correction capability of the decoding algorithm. Stated differently, CWER reflects the number of codewords out of a collection of codewords that have at least one bit error after the decoding process. A lower CWER implies better decoding performance and higher reliability, while a higher CWER suggests that the algorithm may struggle to effectively correct errors. With respect to using hard information with the decoding algorithm, CWER is functionally dependent on the raw-bit-error-rate (RBER), which is a raw measure of errors occurring in the absence of any correction.

With respect to using soft information with the decoding algorithm, CWER is functionally dependent on the RBER and a high reliability error rate (HRER), which measures the reliability of bits marked as "highly reliable" by the soft input. More specifically, HRER quantifies the error rate among bits identified as "highly reliable" based on soft information. Accordingly, for a given RBER, an increase in the HRER leads to an increase in the CWER. This relationship suggests that when more errors are falsely assigned high reliability values, it becomes more challenging for the decoding algorithm to correctly reconstruct the original codewords, thus leading to a higher CWER.

Additionally, LDPC codes come in two main types based on the column weight (CW), which is the number of parity bits with which each codeword bit interacts. Regular LDPC codes have a fixed CW for all codeword bits, while irregular LDPC codes allow for varying CWs. A high readability error bit impacts CW number of parity checks and hence different types of LDPC codes-whether regular or irregular and CW distribution—are impacted differently by HRER and, consequently, the CWER is a function of HRER and LDPC type. Accordingly, decoders may employ specific operations to handle different types of LDPC codes and HRER levels to tune error-correction capabilities.

To initiate the decoding process, the memory sub-system controller receives a codeword sent over a communication channel. The memory sub-system controller calculates a syndrome vector which indicates that the codeword includes errors. This description enhances the decoding process for LDPC codes based on the syndrome, such as LDPC codes used in the memory sub-systems. Irregular LDPC codes offer high error correction capabilities but are susceptible to issues such as HRER. Irregular LDPC codes differ from regular LDPC codes in that irregular LDPC codes have H matrices that do not have a uniform number of non-zero entries per column or row, allowing for improved error correction performance closer to the Shannon limit of channel capacity. However, these codes face challenges with HRER, where bits with errors are incorrectly deemed highly reliable, leading to incorrect decoding decisions. This problem is exacerbated in codes with higher CWs, where a single erroneous bit can affect multiple parity checks, spreading errors across the decoded data.

To mitigate the impact of HRER in irregular LDPC codes, in the present description two distinct sets of LLRs (Log-Likelihood Ratios) are employed for decoding: one set for bits associated with lower CWs (such as CWs less than or equal to 9) and another for bits associated with higher CWs (such as CWs greater than 9). Employing two sets of LLRs based on CW of bits addresses the disproportionate influence that bits with a higher CW have on the decoding process when they are erroneous yet marked with high reliability. More specifically, LLRs from a first set of LLRs, namely LLR Set-1 are assigned to bits with lower CWs, and LLR Set-1 has LLRs with higher magnitudes indicating higher confidence. Conversely, LLRs from a second LLR set, namely LLR Set-2 are assigned to bits with higher CWs. The LLRs for LLR Set-2 have a lower average magnitude than the LLRs of LLR Set-1. Assigning LLRs of LLR Set-2 with lower magnitudes to the bits with higher CWs facilitate faster and more efficient bit flipping during decoding of a codeword. This approach allows the decoder to adjust a confidence in the bit values dynamically, improving its ability to correct errors under varying conditions, particularly in scenarios with high HRER.

The systems and methods of the present description enhance the error correction capability of LDPC decoders, particularly in challenging conditions characterized by high HRER. Moreover, the systems and methods improve the efficiency of the decoding process, potentially reducing the time and computational resources required to achieve reliable data recovery. These enhancements to the LDPC decoder have implications for systems where data integrity and reliability are significant, such as in SSDs (solid-state drives), communication systems and data centers. By improving the performance of LDPC decoders in the presence of high HRER, the described systems and methods lead to more robust data storage and transmission solutions, enhancing the overall reliability and efficiency of these systems. The described operations of the enhanced LDPC decoder implements a practical solution to a problem in the decoding of irregular LDPC codes, effectively addressing the challenges posed by HRER and impacting the reliability and efficiency of modern data communication and storage systems.

FIG. 1A illustrates a system 100 that includes a memory sub-system 110 that can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non volatile dual in-line memory modules (NVDIMMs).

The system 100 can be a computing device such as a desktop computer, laptop computer, network server, mobile device, a vehicle (e.g., airplane, drone, train, automobile or other conveyance), Internet of Things (IOT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller) and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., PCIe or CXL bus). The physical host interface can provide an interface for passing control, address, data and other signals between the memory sub-system 110 and the host system 120. FIG. 1A illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) or higher, can store multiple bits per cell. In some examples, each of the memory devices 130 can include one or more arrays of memory cells such as SLCs, MLCs, TLCs, QLCs or some combination thereof. In some examples, a particular memory device can include an SLC portion, an MLC portion, a TLC portion and/or a QLC portion of memory cells. The memory cells of the memory devices 130 can be grouped as pages that can refer to a logical unit of the memory device used to store data. In some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), etc.

A memory sub-system controller 115 (or controller 115 for simplicity) communicates with the memory device(s) 130 to perform operations such as reading data, writing data or erasing data at the memory devices 130 and other such operations. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or other suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations and address translations between a logical address (e.g., a logical block address (LBA), namespace) and a physical address (e.g., physical block address) that are associated with the memory devices 130. The memory sub-system controller 115, for example, may employ a Flash Translation Layer (FTL) to translate logical addresses to corresponding physical memory addresses, which can be stored in one or more FTL mapping tables. In some instances, the FTL mapping table can be referred to as a logical-to-physical (L2P) mapping table storing L2P mapping information. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 include local media controllers 135 that operate in concert with the memory sub-system controller 115 to execute operations on one or more memory cells of the memory devices 130. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

In various examples, the memory sub-system 110 includes an error handling module 113 that tries to execute a decoding algorithm with various combinations of log-likelihood ratio (LLR) sets to compensate for HRER and a range of CW in the H matrix of the LDPC code. In some examples, the memory sub-system controller 115 includes at least a portion of the error-handling module 113. In some examples, the error-handling module 113 is part of the host system 120, an application or an operating system. In other examples, local media controller 135 includes a portion of the error handling module 113 and is configured to perform the functionality described herein.

In operation, the host system 120 manages and controls the flow of data between itself and the memory sub-system 110, ensuring efficient data storage and retrieval operations. More generally, the host system 120 employs the memory sub-system 110 to write data to and read data from the memory sub-system 110. For instance, the host system 120 processes these request for reading and/or write data by interacting with the memory sub-system 110, managing the flow of data to and from the memory device 130 and/or the memory device 140 within the memory sub-system 110. This reading and writing of data enables operation of computing systems where data access and management is needed.

Continuing with examples of operation suppose that the host system 120 outputs a read memory command to the memory sub-system controller 115. In response, the memory sub-system controller 115 operates in concert with the local media controller 135 to read memory cells of the memory device 130 and/or the memory device 140. The memory sub-system controller 115 stores retrieved data in the form of codewords (e.g., LDPC codewords formed of a combination of embedded data and parity bits) in the local memory 119. It is presumed that the data that is read from the memory device 130 and the memory device 140 includes hard reads (1H) and soft reads (1H2S). A soft read (1H2S) is a combination of a hard bit (1H) and two soft bits (2S).

The "hard bit" in this context is a binary read of data where each bit is read and immediately interpreted as either a '0' or a '1', based on a fixed threshold. For example, in NAND flash memory, a voltage level above a certain threshold voltage (Vi) might be interpreted as '0', and below that threshold as '1'. Hard reads are quick and require less computational power but provide less information about the reliability of the read bit. The "soft bits" provide additional information about the probability or confidence level of the bit being a '0' or '1'. In the present description, this additional information is represented in terms of likelihoods or probabilities, which can be converted into LLRs for use in decoding algorithms. Soft reads (1H2S) are employable in error correction because soft reads (1H2S) allow a decoder algorithm of the error-handling module 113 to make more informed decisions based on the degree of certainty about each bit's state. The combination of 1H2S forming the soft read is effective in systems where both speed and data integrity are considered. The hard read forming the hard bit (1H) provides a quick initial assessment of each bit, and the soft bits (2S) offer deeper insights into the potential errors, enhancing the error correction capability of the decoder algorithm of the error-handling module 113.

Furthermore, soft reads (1H2S) provide an indication of reliability of each bit. In the present examples, it is presumed that the reliability is one of three levels, low medium and high, but in other examples, more or less levels are employable.

The reliability of the soft read can be determined by comparing the consistency of the soft bits (2S) with the hard bit (1H) of the soft read (1H2S). Moreover, in other examples, the soft read (1H2S) can be a multibit read that provides finer resolution reliability. Additionally, other criteria are employable to determine the reliability of bits in various examples.

As noted, codeword error rate (CWER) measures the ability of the decoding algorithm to correct errors, indicating the proportion of codewords with errors post-decoding. A lower CWER signifies better performance and reliability. For hard information, CWER depends on the raw-bit-error-rate (RBER), a basic error measure without correction. For soft reads (1H2S), CWER also relies on the high reliability error rate (HRER), which assesses the error rate among bits deemed "highly reliable." An increase in HRER, indicating more errors wrongly marked as reliable, complicates error correction, raising the CWER. As one example, suppose that RBER is 1% and the HRER is 0.1%, the HRER/RBER ratio would be 10%. Conversely, in a situation where the RBER is 1% but HRER is 0.3% (an increase of 0.2%), the HRER/ RBER ratio would be 30%. In this example, CWER for the situation where HRER/RBER=10% will be lower than CWER the situation where HRER/RBER-30% even though RBER is the same for both cases.

Continuing with the example, the error-handling module 113 parses the codewords in the local memory 119 to detect and correct bit errors. For instance, consider an example where the error-handling module 113 detects that a codeword (e.g., LDPC codeword) read from memory device 130 and/or the memory device 140 contains bit errors. To detect errors, the error-handling module 113 can multiply a transpose of the H matrix of the LDPC code with the codeword to provide a syndrome vector. Alternatively, this operation can also be performed without making a matrix multiplication by sequentially checking each parity using XOR operations. If the syndrome vector is non-zero, there is at least one error in the codeword. Moreover, the values of the non-zero syndrome vector are employable to identify check nodes of the LDPC code that have failed parity checks.

The error-handling module 113 generates a decoding parameter to be employed in performing a decoding algorithm. The decoding parameter is a particular codeword LLR, in which the error-handling module 113 assigns an LLR set from the LLR array to each bit of the codeword. The assignment of the input LLR value for each bit is based on a column weight (CW) of a particular bit in the codeword with bit errors. Each bit in the codeword read from the memory device 130 and/or the memory device 140 has a CW that defines the number of parity checks in which the corresponding bit participates. The calculation or determination of CW for each bit of the codeword with parity errors is related to the structure of the H matrix (parity check matrix) of the LDPC code, which is a binary matrix where rows represent parity checks and columns represent codeword bits. Each entry in the H matrix is either '0' or '1'; a '1' indicates that the corresponding bit is included in the parity check for that row. To calculate the CW for a specific bit, the number of '1's in the column of the H matrix that corresponds to that bit are counted. For example, if a column has three '1's, the CW for that bit is three (3), meaning the bit is involved in three (3) different parity checks. This count influences the decoding process, as bits with higher CWs have a greater impact on the overall parity check outcomes, impacting both the error correction capability and the complexity of the decoding process. Moreover, as noted, the memory sub-system 110 has an irregular H matrix, so different bits can have different CWs.

In examples where the CW of a particular bit is below a threshold, the error-handling module 113 assigns a first LLR set, LLR Set-1 employed as the codeword LLR (the decoding parameter) for the decoding algorithm. The threshold could be based on an analysis of the H matrix of the LDPC code. For instance, such as CWs that make up 90% of the CWs of the H matrix. As an example, suppose that the H matrix of the LDPC code has CWs of four (4) or less that make up 60% of the H matrix, CWs of five-nineteen (5-19) that make up 30% of the H matrix and CWs of 20 or more make up 10% of the H matrix. In this situation, the threshold could be a CW of 20, wherein CWs less than the threshold are referred to as lower CWs, and CWs meeting or exceeding the threshold are higher CWs. Thus, if a given bit has a CW less than 20 (less than the threshold), the error-handling module 113 selects the LLR Set-1 for the codeword LLR provided to the decoding algorithm. To simplify calculations, the LLRs of the LLR array (including the LLR Set-1) are integer values that are mapped to specific reliabilities. The particular values can be based for example, on the RBER and the HRER. Table 1 provides an example for the LLR Set-1 that correlates a soft read (1H2S) bit value and reliability with a particular LLR value.

TABLE 1

| Bit Value | Reliability | LLR Value |
|---|---|---|
| 1 | High | −14 |
| 1 | Medium | −10 |
| 1 | Low | −5 |
| 0 | Low | 5 |
| 0 | Medium | 10 |
| 0 | High | 14 |

Conversely, in an example where the CW for a given bit meets or exceeds the threshold (e.g., the CW is higher) the error-handling module 113 selects a second LLR set from the LLR array, namely, LLR Set-2 as for the codeword LLR (the decoding parameter) provided to the decoding algorithm. Table 2 provides an example for the LLR Set-1 that correlates a soft read (1H2S) bit value and reliability with a particular LLR value.

TABLE 2

| Bit Value | Reliability | LLR Value |
|---|---|---|
| 1 | High | −7 |
| 1 | Medium | −5 |
| 1 | Low | −3 |
| 0 | Low | 3 |
| 0 | Medium | 5 |
| 0 | High | 7 |

It is noted that the particular values for LLR Set-1 (defined in Table 1) and for LLR Set-2 (defined in Table 2) could be different in other examples. However, in each such example, LLR Set-2 has a smaller range of magnitudes ({−7 . . . 7} in the provided example) than the LLR Set-1 ({−14 . . . 14} in the provided example). It is noted that the sets of LLRs (both LLR Set-1 and LLR Set-2) can be tuned based on HRER of the memory device(s) 130 and/or the memory device(s) 140. Additionally, although the present examples are illustrated and described as having two LLR sets, in other examples, there could be three or more LLR sets. In this situation, different CW ranges are assigned different LLR sets.

Responsive to generating a codeword LLR (LLR Set-1 or LLR Set-2 for each bit in the codeword) based on the CW for each bit of the codeword LLR as the decoding parameter, the error-handling module 113 initializes the decoding algorithm with the codeword LLR as the decoding parameter. More specifically, each variable node (corresponding to a bit in the codeword) is initialized with the corresponding LLR set of the codeword LLR, referred to as initial LLRs denoted as $L_{init}$. These initial LLRs are employed in an iterative process, exchanging messages between variable nodes and associated check nodes. For example, if a variable node V is connected to three check nodes C1, C2 and C3, messages mC1→V, mC2→V and mC3→V (e.g., each mC1 . . . mC3 representing the message that is passed from check node to variable node) would be computed based on existing LLRs and specific rules.

The error-handling module 113 employs a MinSum decoder, which is alternatively referred to as a min-sum decoder. The MinSum decoder is a streamlined decoding algorithm used with LDPC codes, offering a computationally efficient alternative to the more complex Belief Propagation (BP) algorithm. The MinSum decoder operates by iteratively passing messages between variable nodes (representing codeword bits) and check nodes (representing parity checks) within a Tanner graph of the LDPC code. The MinSum decoder implements an iterative error correction process that employs two specific values, min1 and min2. During each iteration, the decoder of the error-handling module 113 operates through a series of message exchanges between the variable nodes and check nodes. Each check node receives messages from connected variable nodes, which contain information about the LLRs of bit values. The check node determines whether the parity condition represents by the check node is satisfied based on these incoming messages.

To update the messages sent back to the variable nodes, the MinSum decoder calculates the two smallest absolute values (min1 and min2) among the incoming messages at each check node. Min1 is the smallest absolute value and min2 is the second smallest. Responsive to determining min1 and min2, the check node updates the outgoing message based on min1 and min2. If a parity check fails, indicating that there is an inconsistency among the bits involved in that check, the check node sends back messages that adjust the reliability values of the connected variable nodes. Specifically, the variable node associated with min1 (the least reliable node based on the incoming messages) receives an update influenced by min2, and every other variable node connected to the check node receives an update influenced by min1. Thus, the MinSum decoder ensures that the least reliable bit is given the most significant adjustment, pushing the least reliable bit towards correction in subsequent iterations. Scalar values and offset values can be applied to min1 and min2 in the MinSum decoder to more closely approximate the operation of a decoder that employs the BP algorithm.

As an example, consider a situation where a scalar value denoted as 's' and offset value denoted as 'o', mC1→V=s*min1 (or min 2)+o where min1 and min2 correspond to smallest/second smallest LLR to check node C1. After the first iteration, the LLR for V would be updated using the formula and the set of decoding parameters (e.g., Lnew=$(L_{init})$+mC1→V+mC2→V+mC3→V). The process is then repeated for a set number of iterations or until certain conditions are met, using the updated Lnew as the starting point for the next round. Finally, a hard decision is made based on the resulting $L_{final}$; if $L_{final}$>0, the bit is decoded as '1', and if $L_{final}$<0, it is decoded as '0'. Accordingly, if the LLR of a given bit is changed from positive to negative through an iteration, the bit is flipped from '0' to '1'. Conversely, if the LLR of a given bit is changed from negative to positive through an iteration, the given bit is flipped from '1' to '0'. This iterative mechanism allows for more effective error correction by continually updating the LLRs.

The implication of the described example through multiple iteration, when a parity check fails, a bit with the lowest reliability is flipped next. However, when a bit with a high reliability (reliability is set to high) is the reason for a failed parity check, the correct bit (e.g., often a bit with lower reliability) will be flipped instead of the erroneous high reliability bit because of the initial $L_{init}$ for the high reliability bit. To compensate for this situation, the error-handling module 113 is configured to include the second LLR set, LLR Set-2 in the codeword LLR that is employable for variable nodes (corresponding to bits of the codeword) that have a CW that meet or exceed the threshold (e.g., a CW of 20 or more in the described example). As noted, during each iteration of the MinSum decoding process, the LLRs are updated based on the messages received from the check nodes. The check nodes calculate the discrepancy in the parity checks and send back adjustments to the variable nodes (bits). For bits with higher CWs (using the LLR Set-2), because the range in magnitude of the LLR Set 2 is less than LLR Set-1, the lower starting LLRs mean that values can be adjusted more aggressively. This facilitates quicker convergence in problematic areas of the codeword, allowing for more effective error correction in regions where errors are more likely to propagate due to the higher influence of these bits. Consequently, in situations where a high reliability bit is erroneous (as described above), and the bit corresponds to a variable node with a higher CW, this erroneous high reliability bit would be flipped with fewer iterations than if the LLR Set-1 were used as the starting point.

Stated differently, employing the LLR Set-2 makes bit flipping easier (bits are flipped with less iterations) in the decoding process. Conversely, due to the relative rarity of an erroneous high reliability bits (e.g., about 0.1%-0.3% in some examples), the LLR Set-1 is employed for bits with the lower CW (e.g., a CW lower than the threshold). In many situations, it is advantageous to apply LLR Set-2 to only high reliability bit errors. However, the location of the high reliability errors is not known. Accordingly, given that higher CW high reliability bit errors are more problematic for the decoder compared to lower CW high reliability bit errors, making it easier for the decoder to flip higher CW bits by using LLR Set-2 for higher CW bits help mitigate the HRE problem.

If the decoding algorithm executed by the error-handling module 113 is unable to correctly decode the codeword, the error-handling module 113 selects a subsequent decoding parameter to be used in performing the decoding algorithm, which can be referred to as a modified codeword LLR. As previously described, the modified codeword LLR is obtained by varying the selected LLR set (LLR Set-1 and/or LLR Set 2) for each bit of the codeword, or some subset thereof. The error-handling module 113 initializes the decoding algorithm with an LLR set of the modified codeword LLR and performs the decoding algorithm. With each iteration of the decoding algorithm, as previously described, the LLR is updated for the modified codeword LLR. The decoding algorithm is then repeated for a set number of iterations or until certain conditions are met.

Stated differently, the error-handling module 113 iteratively obtains new decoding parameters (e.g., the modified codeword LLR), initializes the decoding algorithm with an LLR set of the newly obtained decoding parameter. The error-handling module 113 performs the decoding algorithm updating LLR values of the newly obtained decoding parameter until the decoding algorithm correctly decodes the codeword or each possible permutation of the LLR set from the LLR array is used as a decoding parameter utilized in the decoding algorithm (e.g., each possible decoding parameter). If each possible decoding parameter is utilized in the decoding algorithm and the decoding algorithm is unable to correctly decode the codeword, the error handling module 113 flags the codeword as unreliable or erroneous.

Furthermore, in a variant operation the error-handling module 113 initially assigns each bit of the codeword the same LLR set (independent of the CW), such that the same LLR set is used as the codeword LLR. In this situation, if the decoding by the MinSum decoder fails, the error-handling module 113 selects different LLRs for different CWs for the codeword LLR for a second decoding operation. Thus, in the second decoding operation, the bits with the lower CW are assigned the first LLR set (LLR Set 1) and the bits with the higher CW are assigned the second LLR set (LLR Set-2). In some situations where the HRER is low, this variant may avoid correction capability loss that would otherwise might occur using different LLR sets.

In examples where the codework is corrected by the decoding operation of the error-handling module 113, the corrected codeword is stored in the local memory 119. Additionally, in some examples, the memory sub-system controller 115 can extract embedded data (e.g., remove parity bits) from the corrected codeword, and output the embedded data to the host system 120, such as in a return operation in response to a read memory request provided by the host system 120. In other examples, the entire codeword (including the parity bits) is output to the host system 120.

Accordingly, by selecting different LLR sets (LLR Set-1 and LLR Set-2) based on the CW of each respective bit in the codeword, the correction capability of the of the decoding algorithm is improved. In particular, bits of a codeword with a higher CW (e.g., a CW meeting or exceed the threshold) are flipped more easily (in fewer iterations), thereby increasing the overall correction capability of the decoding algorithm of the error-handling module 113 before a maximum number of iterations is reach. The benefits of using the different LLR sets is further exacerbated in situations with a relatively high HRER/RBER ratio, such as situations where the HRER/RBER is 20% or more. In situations where the memory device 130 and the memory device 140 is non-volatile, NAND memory, a relatively high HRER (which impacts the CWER) is experience due to fail tails of threshold voltage (Vt) distribution, the miscalibration of hard read thresholds can increase the HRER. Thus, in these situations, the use of the different LLR sets (LLR Set-1 and LLR Set-2) can improve the overall performance of the memory sub-system 110.

Figure 1B:
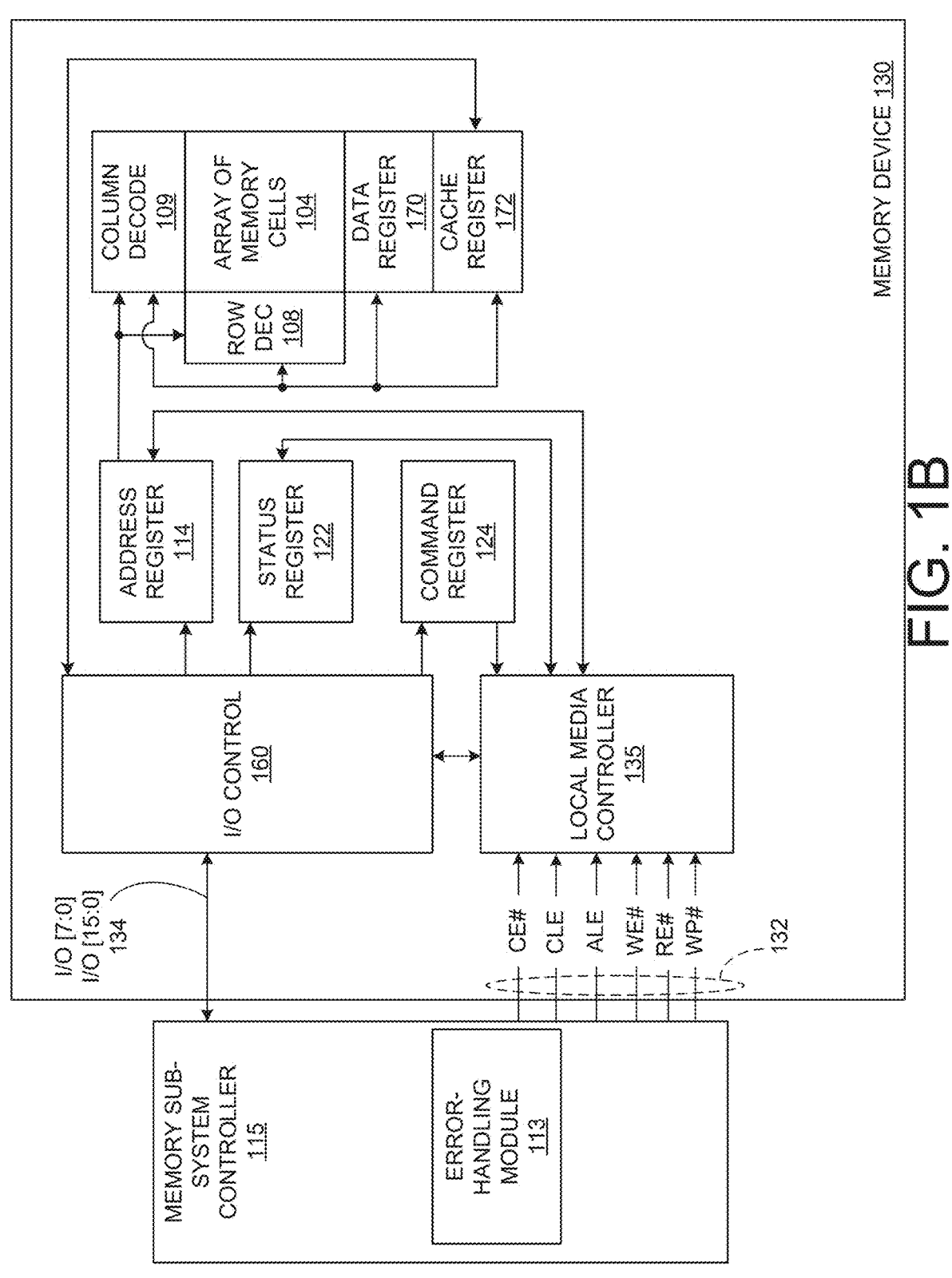
FIG. 1B illustrates a simplified block diagram of an example memory device in communication with a memory sub-system controller.

FIG. 1B illustrates a simplified block diagram of an example of a first apparatus, in the form of a memory device 130, in communication with an example of a second apparatus, in the form of a memory sub-system controller 115 of a memory sub-system (e.g., the memory sub-system 110 of FIG. 1A). Some examples of electronic systems include personal computers, personal digital assistants (PDAs), digital cameras, digital media players, digital recorders, games, appliances, vehicles, wireless devices, mobile telephones, etc. The memory sub-system controller 115 (e.g., a controller external to the memory device 130), can be a memory controller or other external host device.

The memory device 130 includes an array of memory cells 104 logically arranged in rows and columns. The memory cells 104 form a non-transitory computer readable medium. Memory cells of a logical row are connected to the same access line (e.g., a wordline) while memory cells of a logical column are selectively connected to the same data line (e.g., a bit line) in some examples. In some examples, a single access line is associated with more than one logical row of memory cells and a single data line may be associated with more than one logical column. Memory cells (not shown in FIG. 1B) of at least a portion of the array of memory cells 104 are capable of being programmed to one of at least two target data states.

The memory device 130 includes row decode circuitry 108 and column decode circuitry 109 for decoding address signals. Address signals are received and decoded to access an array of memory cells 104 of the memory device 130. The memory device 130 also includes input/output (I/O) control circuitry 160 to manage input of commands, addresses and data to the memory device 130 as well as output of data and status information from the memory device 130. The memory device 130 has an address register 114 and is in communication with the I/O control circuitry 160, the row decode circuitry 108 and the column decode circuitry 109 to latch the address signals prior to decoding. The memory device 130 also includes a command register 124 in communication with the I/O control circuitry 160 and a local media controller 135 (e.g., the local media controller 135 of FIG. 1A) to latch incoming commands.

A controller (e.g., the local media controller 135 internal to the memory device 130) controls access to the array of memory cells 104 in response to the commands and generates status information for the external memory sub-system controller 115. For example, the local media controller 135 is configured to perform access operations (e.g., read operations, programming operations and/or erase operations) on the array of memory cells 104. The local media controller 135 is in communication with the row decode circuitry 108 and the column decode circuitry 109 to control the row decode circuitry 108 and the column decode circuitry 109 in response to the addresses.

The local media controller 135 is also in communication with a cache register 172. The cache register 172 latches data, either incoming or outgoing, as directed by the local media controller 135 to temporarily store data while the array of memory cells 104 is busy writing or reading, respectively, other data. During a program operation (e.g., write operation), data is passable from the cache register 172 to the data register 170 for transfer to the array of memory cells 104, and new data can be latched in the cache register 172 from the I/O control circuitry 160. During a read operation, data is passable from the cache register 172 to the I/O control circuitry 160 for output to the memory sub-system controller 115. New data is passable from the data register 170 to the cache register 172. The cache register 172 and/or the data register 170 form (e.g., or form a portion of) a page buffer of the memory device 130. The page buffer includes sensing devices (not shown in FIG. 1B) to sense a data state of a memory cell of the array of memory cells 104. For example, the sensing devices sense a state of a data line connected to that memory cell. The memory device 130 also includes a status register 122 in communication with the I/O control circuitry 160 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE # and/or a write protect signal WP #. Additional or alternative control signals (not shown) can be further received over control link 132 depending upon the nature of the memory device 130. In some examples, the memory device 130 receives command signals (which represent commands), address signals (which represent addresses) and data signals (which represent data) from the memory sub-system controller 115 over a multiplexed input/output (I/O) bus 134 and outputs data to the memory sub-system controller 115 over the I/O bus 134.

In some examples, the commands are received over input/output (I/O) pins [7:0] of the I/O bus 134 at I/O control circuitry 160 and may then be written into the command register 124. The addresses are received over input/output (I/O) pins [7:0] of the I/O bus 134 at I/O control circuitry 160 and written into the address register 114. The data is receivable over input/output (I/O) pins [7:0] for an 8-bit device or input/output (I/O) pins [15:0] for a 16-bit device at I/O control circuitry 160 and is writable into the cache register 172. The data is subsequently written into the data register 170 for programming the array of memory cells 104 in some examples.

In some examples, the cache register 172 is omitted, and in such examples, the data is written directly into the data register 170. Additionally or alternatively, data is output over input/output (I/O) pins [7:0] for an 8-bit device or input/output (I/O) pins [15:0] for a 16-bit device. Moreover, it is noted that although reference is made to I/O pins, in other examples, a different conductive node providing for electrical connection to the memory device 130 by an external device (e.g., the memory sub-system controller 115), such as conductive pads or conductive bumps could be used in addition to or as a replacement for the I/O pins.

The example memory device 130 of FIG. 1B has been simplified. Moreover, in other examples, the functionality of the various block components described with reference to FIG. 1B are not segregated to distinct components or component portions of an integrated circuit device. For example, a single component or component portion of an integrated circuit device could be adapted to perform the functionality of more than one block component of FIG. 1B. Alternatively, components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) are useable in various examples.

Figure 2:
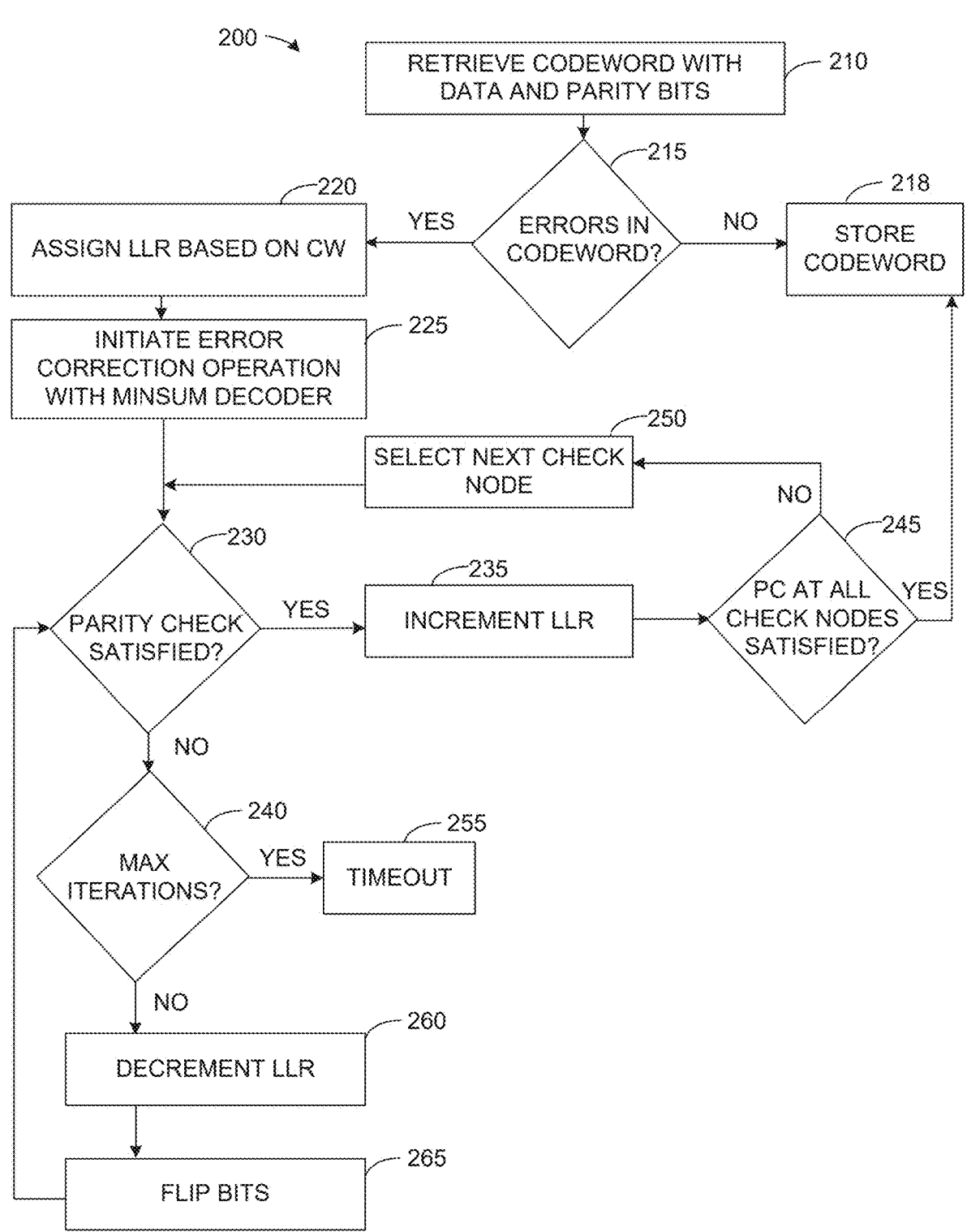
FIG. 2 illustrates a flowchart of an example method for decoding data.

FIG. 2 illustrates a flowchart of an example method 200 for decoding data. The method 200 can be implemented, for example, by a controller, such as the memory sub-system controller 115 of the system 100 of FIG. 1A. At block 210 the controller retrieves a codeword that includes both data and parity bits. This codeword is typically output from a communication channel or retrieved from a storage device, where the codeword has been previously encoded with LDPC codes that include parity bits for error detection and correction. The bits of the codeword have a reliability (e.g., low, medium or high), as indicated earlier Tables.

In block 215, an error-handling module (e.g., the error-handling module 113 of FIG. 1A) of the controller determines whether there are errors in the codeword. To make this determination, the error-handling module multiplies the codeword with a transpose of an H matrix of the LDPC code to provide a syndrome vector. Alternatively, this operation can also be performed without making a matrix multiplication by sequentially checking each parity using XOR operations. If the syndrome vector is zero, there are no errors in the codeword. If the syndrome vector is non-zero, there is at least one error in the codeword, and the non-zero value of the syndrome vector is employable to identify check nodes that have failed parity checks. If the determination at block 215 is negative (e.g., NO), the method 200 proceeds to block 218. If the determination at block 215 is positive (e.g., YES), the method 200 proceeds to block 220.

At block 218 (reached when no errors are present in the codeword), the codeword is stored in a local memory (e.g., the local memory 119) of the controller. The data extracted from the codeword can be output to an external system, such as a host (e.g., the host system 120 of FIG. 1A). For instance, in some such examples, in response to detecting that no errors are present in the codeword, the parity bits are removed from the codeword, and the remaining data is provided to the external system, such as in a return operation in response to a read memory request.

At block 220 (reached when error(s) are detected in the codeword), the error-handling module assigns LLR sets to each bit of the codeword to provide a codeword LLR. The assignment of LLR sets is based on the CW associated with each bit, such that bits with lower CWs (where the CW does not meet the threshold) receive the first set of LLRs (LLR Set-1). Conversely, the error-handling module 113 assigns bits with a higher CW (the CW meets or exceeds the threshold) a second set of LLRs (LLR Set-2). The first LLR set and the second LLR set are formed of integers corresponding to reliability of bits in the codeword, demonstrated in Table 1 and Table 2. The range in magnitudes of the first LLR set is greater than the range in magnitudes of the second LLR set.

At block 225, the error-handling module initiates an error correction operation using a decoding algorithm that employs a MinSum decoder, and the codeword LLR is employed as an initiation parameter of the MinSum decoder. Also at block 225, a particular check node of a parity check (determined in block 215) is selected. The MinSum decoder calculates two minimum values, min1 and min2 (where min2>min1) for the selected parity check node. In some examples, scalar and offsets are applied to min1 and min2.

At block 230, the error-handling module determines whether the parity check of the selected check node is satisfied. If the determination at block 230 is positive (e.g., YES), the method 200 proceeds to block 235. If the determination at block 230 is negative (e.g., NO), the method 200 proceeds to block 240.

At block 235 (reached if the parity check at block 230 for the selected node is satisfied), the LLR for each variable node connected to the selected check node is incremented by the error correcting module. The MinSum decoder is configured such that the variable node with a lowest LLR is incremented by min2, and the remaining variable node(s) are incremented by min1. At block 245, the error-handling module determines whether the parity check (PC) of check nodes is satisfied. If the determination at block 245 is positive (e.g., YES), then no errors remain in the codeword, and the method 200 proceeds to block 218. If the determination at block 245 is negative (e.g., NO), the method 200 proceeds to block 250. At block 250, a next check node is selected by the error-handling module and the method 200 returns to block 230.

At block 240 (reached if the parity check at block 230 for the selected check node fails), the error-handling module makes a determination as to whether a maximum number of iterations of the MinSum decoder has been reached. If the determination at block 240 is positive (e.g., YES), the method 200 proceeds to block 255. If the determination at block 240 is negative (e.g., NO), the method 200 increments a number of executed iterations and proceeds to block 260. At block 255, the method 200 reaches a timeout status and the method 200 ends.

At block 260 (reached if the parity check at block 230 for the selected node is not satisfied and the maximum number of iterations at block 240 has not been reached), the error correcting module increments the LLR for each variable node connected to the selected check node. The MinSum decoder is configured such that the variable node with a lowest LLR is decremented by min2, and the remaining variable node(s) are decremented by min1. At block 265, the bit(s) of the variable node are flipped, if the decrementing of the LLR at block 260 changes a sign of bit(s) at a variable node. The method 200 of FIG. 2 shows a simplified version of the decoding operation for illustration purposes. Actual decoding operation employs more efficient approach with that includes parallelism and computational efficiency.

As demonstrated, by implementing the method 200, bits associated with a higher CW (e.g., a CW meeting or exceeding the threshold) are assigned the second set of LLRs (LLR Set-2), rather than the first set of LLR (LLR Set-1). Thus, bits of the codeword with the higher CWs might be flipped (e.g., at block 265) with fewer iterations than bits of the codeword with the lower CWs. Thus, in situations where an erroneous bit is a bit with a high reliability and the bit has a higher CW, this erroneous (high reliability) bit with the higher CW would be flipped with fewer iterations (e.g., flipped more easily) than if this bit has a lower CW.

In a variant of the method 200, each bit (independent of the CW) of the codeword is initially assigned the same LLR set at block 220. In this situation, if the decoding by the MinSum fails (e.g., the block 255 is reach), the variant method is executed a second time, wherein at block 220, the bits with the lower CW are assigned the first LLR set (LLR Set-1) and the bits with the higher CW are assigned the second LLR set (LLR Set-2). In some situations where the HRER is low, this variant may avoid potential correction capability loss that might otherwise occur using different LLR sets.

Figure 3:
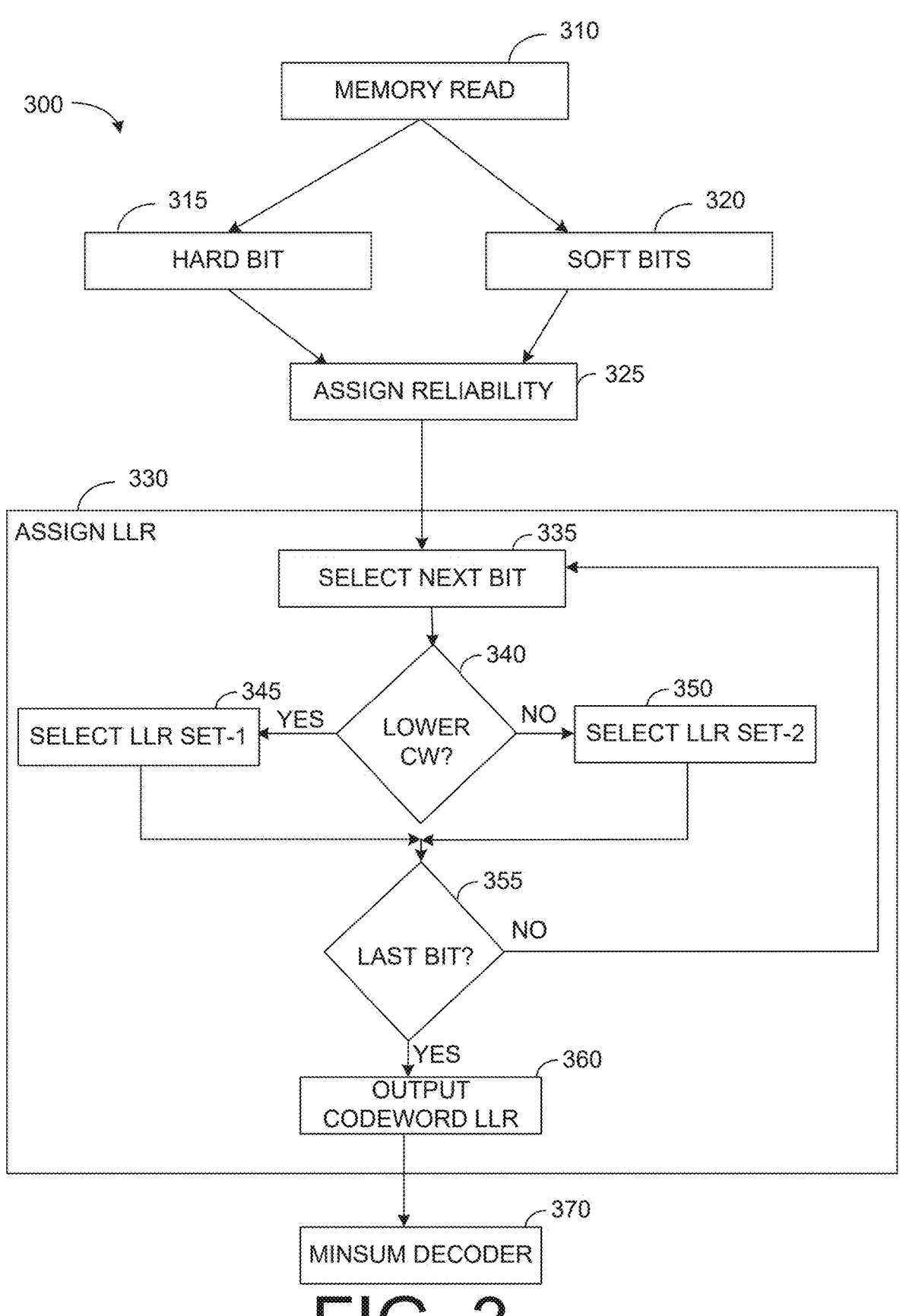
FIG. 3 illustrates a flowchart of an example method for decoding data.

FIG. 3 illustrates a flowchart of an example method 300 for decoding data. The method 300 can be implemented, for example, by a controller, such as the memory sub-system controller 115 of the system 100 of FIG. 1A. The flowchart of FIG. 3 provides detailed operations for the assignment of LLRs, such as the operations executed for the block 220 of FIG. 2. At block 310, the controller executes a memory read. In the present example, it is presumed that the memory is non-volatile NAND memory, but in other examples, the memory could be a different type of non-volatile memory or the memory could be volatile memory. The memory read provides a codeword. For purposes of simplification, it is presumed that the codeword includes error(s). The codeword is an LPDC codeword that includes both data and parity bits. This codeword is typically output from a communication channel or retrieved from a storage device, where the codeword has been previously encoded with LDPC codes that include parity bits for error detection and correction. The bits of the codeword have a reliability (e.g., low, medium or high).

At block 315, the controller executes hard bit (1H) reads of bits of the codeword. At block 320, the controller executes soft bit (2S) reads of the bits of the codeword. The hard bit (1H) read and the soft bit (2S) reads for each bit of the codeword are combined to form a soft read (1H2S) of the bits of the codeword, and at block 325, the controller assigns a reliability to the soft reads (1H2S) of the bits of the codeword.

At block 330, the bits of the codeword are assigned an LLR (e.g., the LLR for the codeword is generated) by an error-handling module (e.g., the error-handling module 113 of FIG. 1A). At sub-block 335, a next bit of the codeword is selected. At sub-block 340, a determination is made as to whether the selected bit has lower CW (e.g., a CW that is less than a threshold). If the determination at sub-block 340 is positive (e.g., YES), the method 300 proceeds to sub-block 345. If the determination at sub-block 340 is negative (e.g., NO), the method 300 proceeds to sub-block 350.

At sub-block 345, the selected bit is assigned a first LLR set (LLR Set-1) and the method 300 proceeds to sub-block 355. At sub-block 350, the selected bit is assigned a second LLR set (LLR Set-2) and the method 300 proceeds to sub-block 355. The first LLR set and the second LLR set are formed of integers corresponding to reliability of bits in the codeword, demonstrated in Table 1 and Table 2. The range in magnitudes of the first LLR set is greater than the range in magnitudes of the second LLR set.

At sub-block 355, a determination is made as to whether the selected bit is the last bit in the codeword. If the determination at sub-block 355 is negative (e.g., NO), the method 300 returns to sub-block 335. If the determination at sub-block 355 is positive (e.g., YES), the method 300 proceeds to sub-block 360. At sub-block 360, a codeword LLR is output (e.g., an LLR for each bit in the codeword). The method 300 of FIG. 3 shows an example where two different LLR sets are used. The proposed approach can be extended to three or more LLR sets covering different CW ranges as opposed to the two LLR sets shown in FIG. 3.

At block 370, the error-handling module executes a MinSum decoder using the codeword LLR as an initiation parameter. The MinSum decoder corrects errors in the codeword in a manner described herein.

In a variant of the method 300, each bit (independent of the CW) of the codeword is initially assigned the same LLR set, namely the first LLR Set (LLR-Set 1) such that sub-block 345 is executed for every bit of the codeword. In this situation, if the decoding by the MinSum fails, the variant method is executed a second time, wherein the bits with the lower CW are assigned the first LLR set (LLR Set-1) and the bits with the higher CW are assigned the second LLR set (LLR Set-2). In some situations where the HRER is low, this variant may avoid potential correction capability loss that might otherwise occur using different LLR sets.

Figure 4:
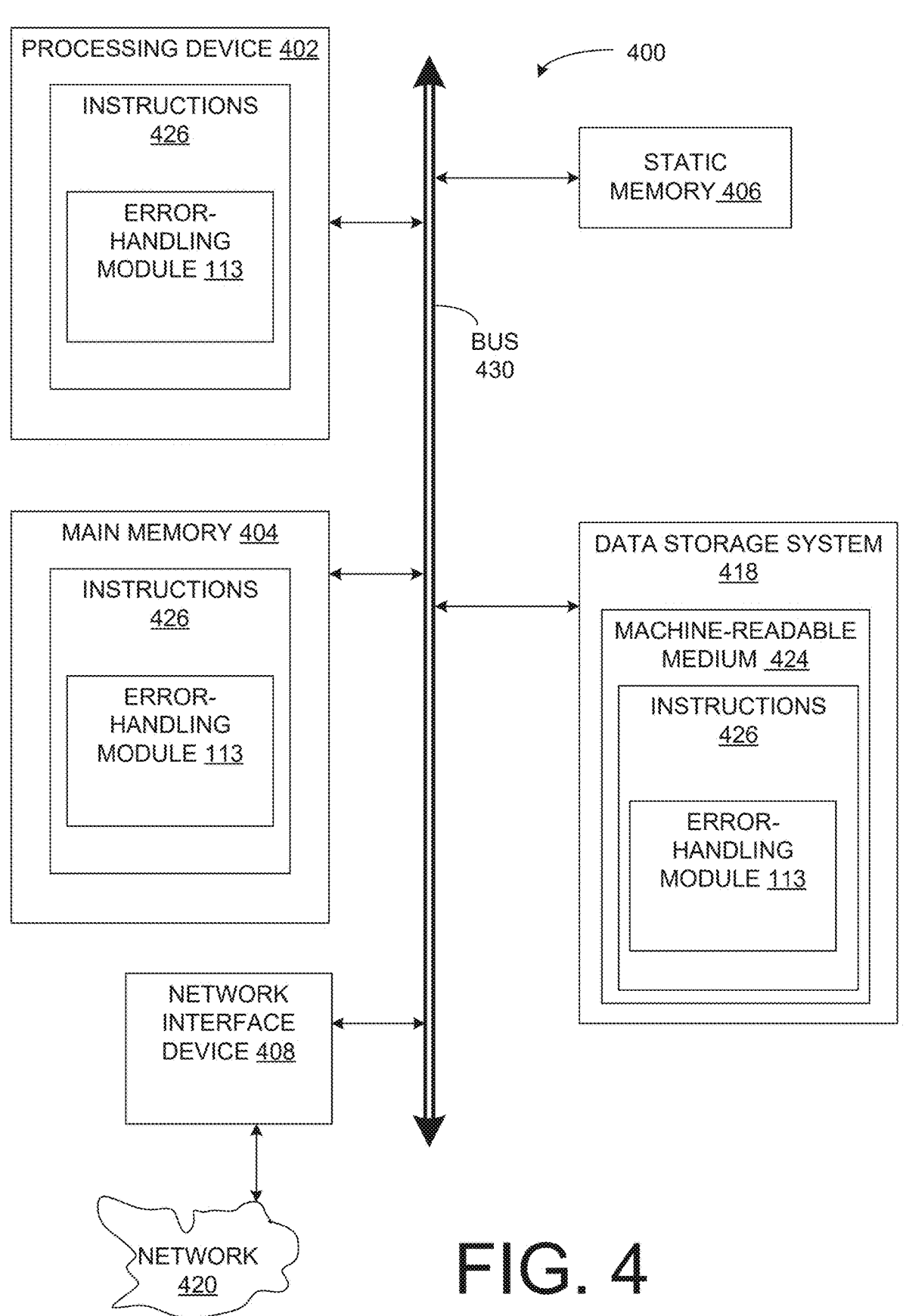
FIG. 4 illustrates an example of a computer system (a machine) in which examples of the present description may operate.

FIG. 4 illustrates an example machine of a computer system 400 (a machine) within which a set of instructions, for causing the machine to perform any one or more of the methodologies discussed herein, can be executed. In some examples, the computer system 400 corresponds to a host system (e.g., the host system 120 of FIG. 1A) that includes, is coupled to, or utilizes a memory sub-system (e.g., the memory sub-system 110 of FIG. 1A) or is used to perform the operations of a controller (e.g., to execute an operating system to perform operations corresponding to the error-handling module 113 of FIG. 1A). In other examples, the machine is connected (e.g., networked) to other machines in a LAN, an intranet, an extranet and/or the Internet. In various examples, the machine operates in the capacity of a server or a client machine in client server network environment, as a peer machine in a peer-to-peer (or distributed) network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other examples, the machine may be a computer within an automobile, a data center, a smart factory or other industrial application. Further, while a single machine is illustrated, the term "machine" shall also be taken to include any collection of machines that individually or jointly execute a set (or multiple sets) of instructions to perform the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM) or other non-transitory computer-readable media) and a data storage system 418, which communicate with each other via a bus 430.

The processing device 402 represents one or more general-purpose processing devices such as a microprocessor, a central processing unit, etc. More particularly, the processing device 402 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 402 is implemented with a special-purpose processing devices such as an application specific integrated circuit (ASIC), a field programmable gate array (FPGA), a digital signal processor (DSP), network processor, etc. The processing device 402 is configured to execute instructions 426 for performing the operations discussed herein. In some examples, the computer system 400 includes a network interface device 408 to communicate over the network 420.

The data storage system 418 includes a machine-readable storage medium 424 (also known as a computer-readable medium) that store sets of instructions 426 or software for executing the methodologies and/or functions described herein. The machine-readable storage medium 424 is a non-transitory medium. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418 and/or main memory 404 can correspond to the memory sub-system 110 of FIG. 1A. Accordingly, the machine-readable storage medium 424, the data storage system 418 and/or the main memory 404 are examples of non-transitory computer-readable media.

In some examples, the instructions 426 include instructions to implement functionality corresponding to the error-handling module 113 of FIG. 1A). While the machine-readable storage medium 424 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMs, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method for decoding data, comprising:
    determining by an error-handling module of a controller, that a codeword received from a memory device has errors;
    assigning, by the error-handling module responsive to the determining, an initial set of log-likelihood ratios (LLRs) representing logarithmic ratios of likelihoods that indicate a probability of each bit having a particular binary value to individual bits of the codeword based on a column weight (CW) of each respective bit of a low density parity check (LDPC) code, wherein a first portion of bits of the codeword have a CW that is below a threshold, and the first portion of bit are assigned LLR values from a first LLR set having multiple values over a first magnitude range and a second portion of bits of the codeword have a CW that meets or exceeds the threshold, the second portion of the bits are assigned LLR values from a second LLR set having multiple values over a second magnitude range that is smaller than the first magnitude range;
    responsive to the assigning, iteratively updating, by the error-handling module, the LLRs based on parity check outcomes; and
    decoding, by the controller, embedded data from the codeword based on the updated LLRs.

2. The method of claim 1, further comprising reading, by the controller, the codeword from a memory device.

3. The method of claim 1, wherein the LLRs of the first set of LLRs and the second set of LLRs are integers, wherein bits associated with the second set of LLRs are flipped in fewer iterations of the iteratively updating than bits associated with the first set of LLRs.

4. The method of claim 1, wherein the assigning is executed in response to a failed decoding for the codeword in which each bit of the codeword is assigned a same LLR set, and the LLRs are updated using a MinSum decoding process.

5. The method of claim 1, wherein bits of the codeword are assigned a given set of LLRs of at least three sets of LLRs based on the CW of a corresponding bit.

6. The method of claim 1, wherein values of the LLRs of the first LLR set and the second LLR set are based on error rates of bits of the memory device that have LLR values with magnitudes corresponding to a greatest magnitude values within a respective one of the first LLR set or the second LLR set.

7. The method of claim 1, further comprising:
    detecting, by the controller, that the errors of the codeword have been corrected by the decoding; and
    returning, by the controller, embedded data of the codeword responsive to the detecting.

8. A system for decoding data stored in a memory device, comprising:
    a memory device; and
    a processing device coupled to the memory, the processing device to perform operations comprising:
        determining by an error-handling module of a controller, that a codeword received from a memory device has errors;
        assigning, responsive to the determining, an initial set of log-likelihood ratios (LLRs) representing logarithmic ratios of likelihoods that indicate a probability of each bit having a particular binary value to individual bits of the codeword based on a column weight (CW) each respective bit of a low density parity check (LDPC) code, wherein a first portion of bits of the codeword have a CW that is below a threshold, and the first portion of bit are assigned LLR values from a first LLR set having multiple values over a first magnitude range and a second portion of bits of the codeword have a CW that meets or exceeds the threshold, the second portion of the bits are assigned LLR values from a second LLR set having multiple values over a second magnitude range that is smaller than the first magnitude range;
        responsive to the assigning, iteratively updating the LLRs based on parity check outcomes; and decoding embedded data from the codeword based on the updated LLRs.

9. The system of claim 8, the operations further comprising reading the codeword from a memory device.

10. The system of claim 8, wherein the LLRs of the first set of LLRs and the second set of LLRs are integers, and the bits associated with the second set of LLRs are flipped in fewer iterations of the iteratively updating than bits associated with the first set of LLRs.

11. The system of claim 8, wherein the assigning is executed in response to a failed decoding for the codeword in which each bit of the codeword is assigned a same LLR set.

12. The system of claim 8, wherein values of the LLRs of the first LLR set and the second LLR set are based on error rates of bits of the memory device that have LLR values with magnitudes corresponding to a greatest magnitude values within a respective one of the first LLR set or the second LLR set.

13. The system of claim 8, the operations further comprising:
    detecting that the errors of the codeword have been corrected by the decoding; and
    returning embedded data of the codeword responsive to the detecting.

14. A non-transitory computer-readable storage medium comprising instructions that, when executed by a processing device, cause the processing device to perform operations comprising:
    determining by an error-handling module of a controller, that a codeword received from a memory device has errors;
    assigning, by the error-handling module responsive to the determining, an initial set of log-likelihood ratios (LLRs) representing logarithmic ratios of likelihoods that indicate a probability of each bit having a particular binary value to individual bits of the codeword based on a column weight (CW) of each respective bit of a low density parity check (LDPC) code, wherein a first portion of bits of the codeword have a CW that is below a threshold, and the first portion of bit are assigned LLR values from a first LLR set having multiple values over a first magnitude range and a second portion of bits of the codeword have a CW that meets or exceeds the threshold, the second portion of the bits are assigned LLR values from a second LLR set having multiple values over a second magnitude range that is smaller than the first magnitude range;
    responsive to the assigning, iteratively updating, by the error-handling module, the LLRs based on parity check outcomes; and
    decoding, by the controller, data from the codeword based on the updated LLRs.

15. The non-transitory computer-readable storage medium of claim 14, wherein the processing device is to perform operations further comprising:
    reading the codeword from a memory device.

16. The non-transitory computer-readable storage medium of claim 14, wherein the LLRs of the first set of LLRs and the second set of LLRs are integers.

17. The non-transitory computer-readable storage medium of claim 14, wherein values of the LLRs of the first LLR set and the second LLR set are based on error rates of the memory device that have LLR values with magnitudes corresponding to a greatest magnitude values within a respective one of the first LLR set or the second LLR set.

* * * * *